United States Patent [19]

Imamura

[11] Patent Number: 5,117,206
[45] Date of Patent: May 26, 1992

[54] VARIABLE CAPACITANCE INTEGRATED CIRCUIT USABLE IN TEMPERATURE COMPENSATED OSCILLATORS

[75] Inventor: Yoichi Imamura, Suwa, Japan

[73] Assignee: Seiko Epson Corp., Tokyo, Japan

[21] Appl. No.: 623,000

[22] Filed: Dec. 4, 1990

[30] Foreign Application Priority Data

Dec. 5, 1989 [JP] Japan .................................. 1-316205

[51] Int. Cl.⁵ .......................... H01G 4/38; H03B 5/36; H03L 1/02
[52] U.S. Cl. ..................................... 331/158; 331/176; 331/179; 357/51; 361/277; 361/330
[58] Field of Search ............. 331/116 R, 116 FE, 158, 331/176, 179; 334/55, 15; 361/328, 330, 277; 357/51

[56] References Cited

U.S. PATENT DOCUMENTS

| | | | |
|---|---|---|---|
| 4,186,360 | 1/1980 | Ohashi | 334/55 |
| 4,216,451 | 8/1980 | Nishimura et al. | 334/15 |

FOREIGN PATENT DOCUMENTS

| | | |
|---|---|---|
| 62-76801 | 4/1987 | Japan . |
| 62-91006 | 4/1987 | Japan ................................. 331/176 |

OTHER PUBLICATIONS

Uno et al., "A New Digital TCXO Circuit Using a Capacitor-Switch Array", Proceedings of the 37th Annual Frequency Control Symposium, pp. 434-441, 1983.

Primary Examiner—Siegfried H. Grimm
Attorney, Agent, or Firm—W. Douglas Carothers, Jr.

[57] ABSTRACT

A variable capacitance circuit comprising a capacitor array, associated switching elements and transient impedance varying circuits. The capacitor array comprises a plurality of capacitor elements connected to a common node coupled to a crystal oscillator in a crystal oscillator portion and each capacitor element includes a connected switching element that controls activation of selected capacitor elements that are selectively placed in operation as load capacitance with the crystal oscillator to change and adjust its frequency. Further, circuits are provided in a temperature compensation portion to selectively control the activation of the switching elements based upon decoded compensating values provided in memory, such as based upon sensed oscillator temperature conditions. The transient impedance varying circuits comprise multi-level voltage generating circuits for changing the continuity impedance of activated switching elements, among switching elements being switched, to another impedance level or one of a plurality of additional impedance levels. As a result, an intermediate impedance value can be created between the ON and OFF states of the switching elements so that there is no rapid change in the total equivalent capacitance imposed by the capacitor array on the oscillator resulting in smooth capacitance switching which corresponds to smoother frequency adjustment of oscillator output.

28 Claims, 4 Drawing Sheets

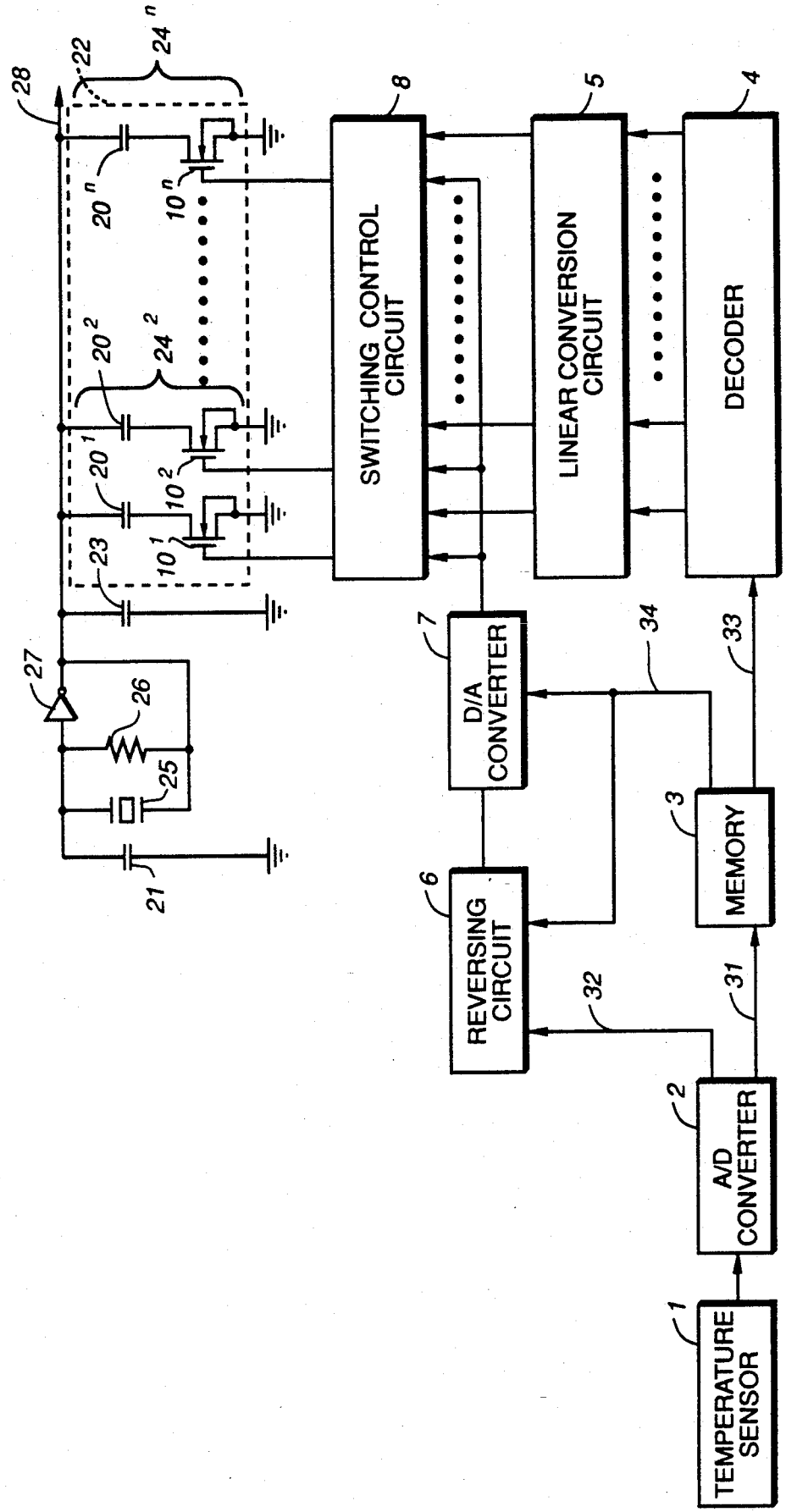
FIG._1

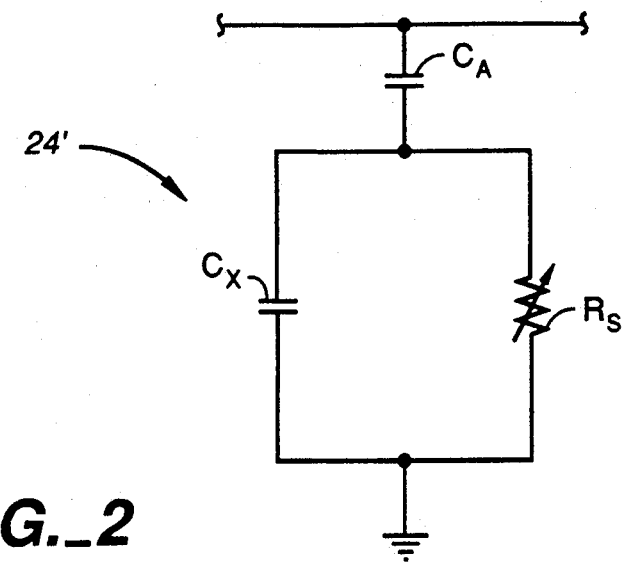
FIG._2
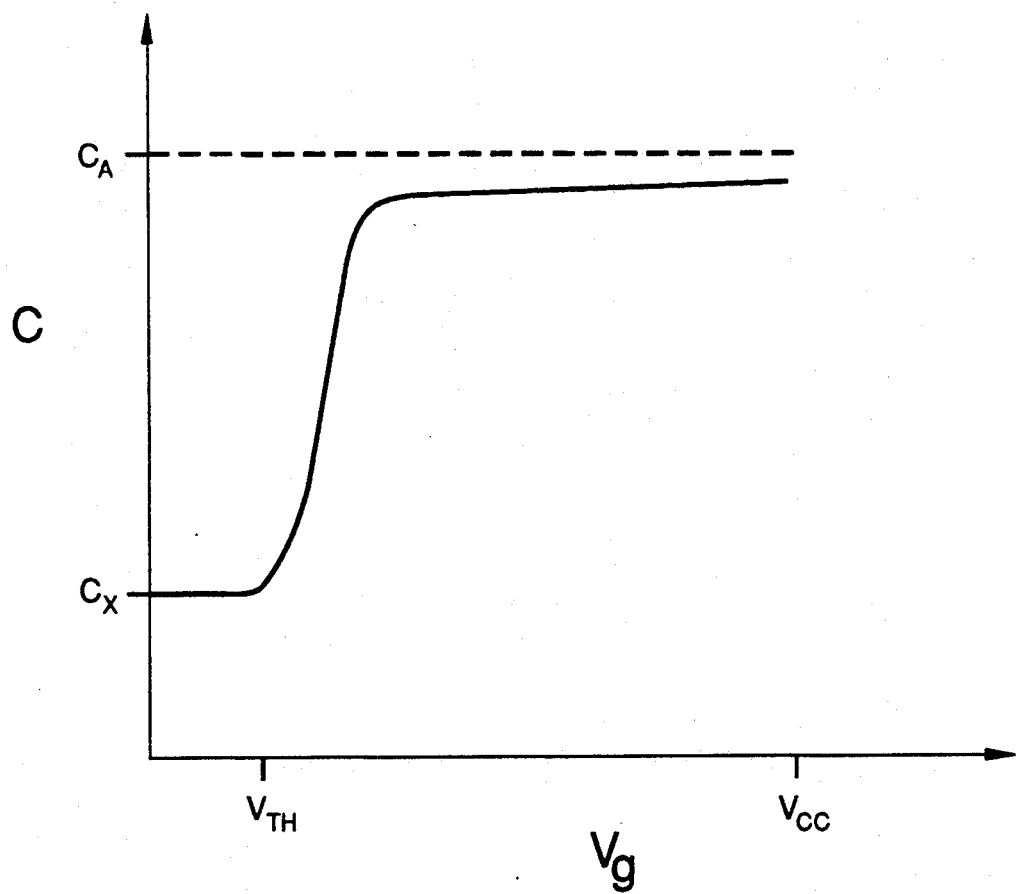
FIG._3

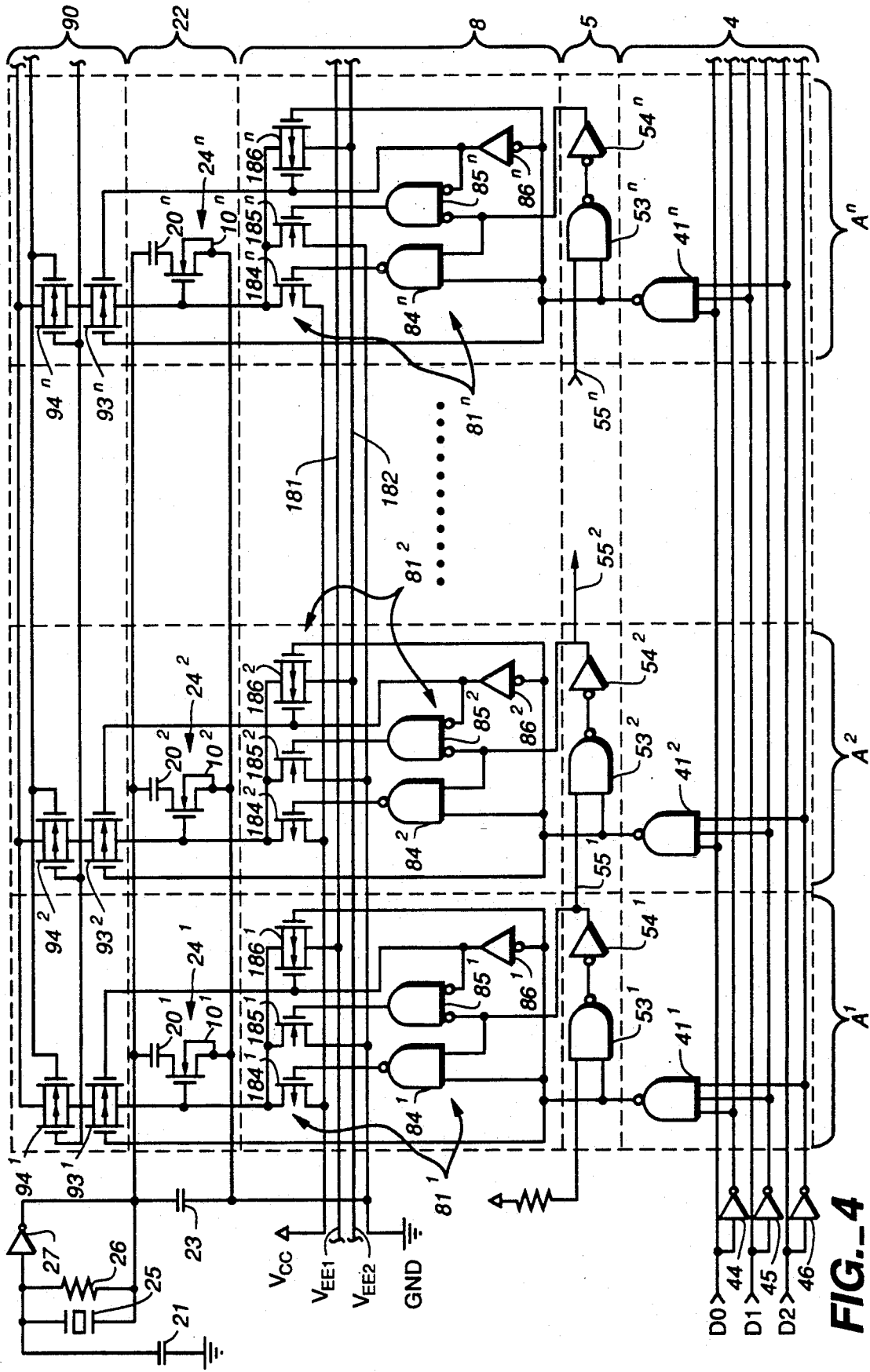
FIG._4

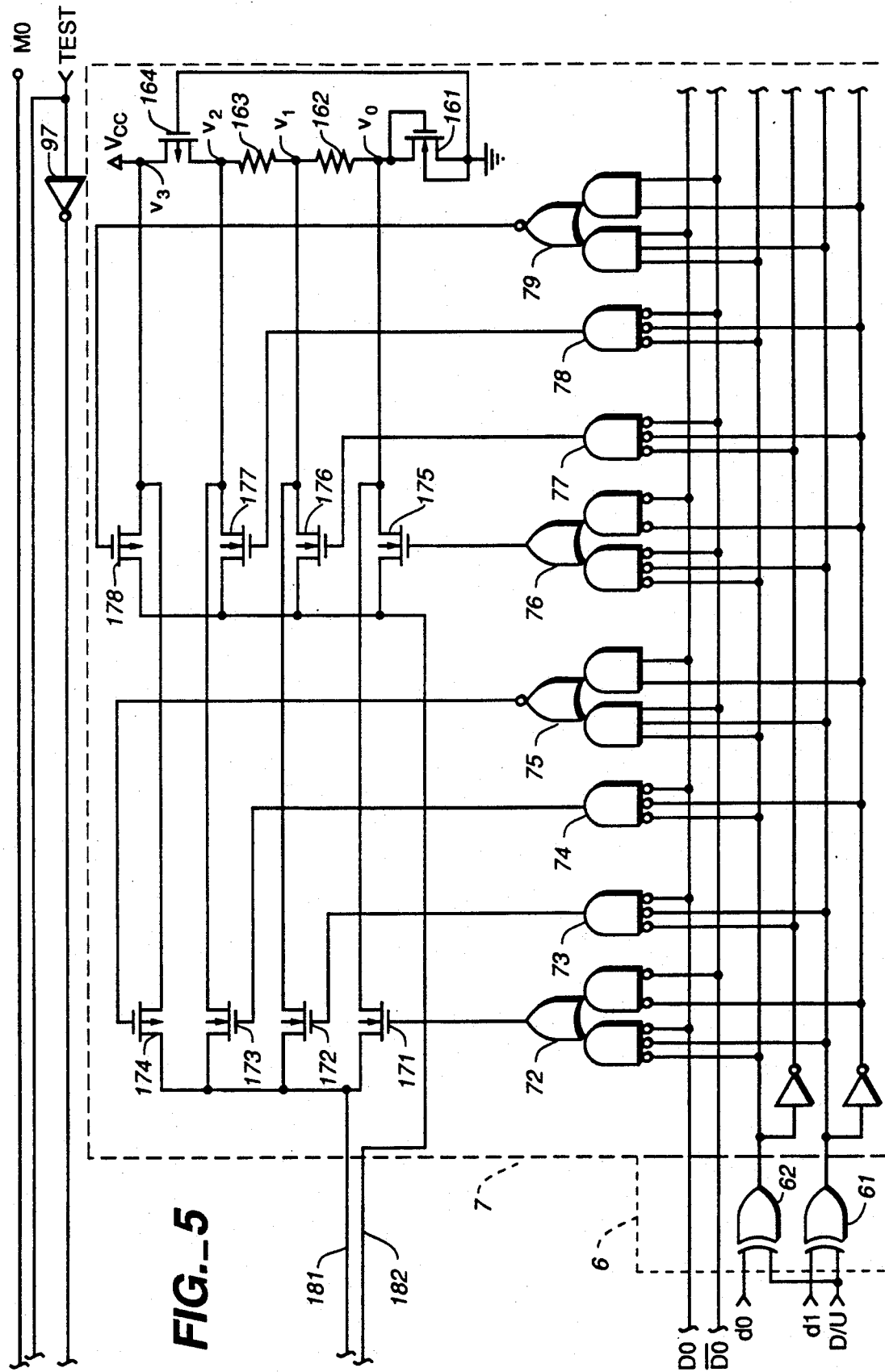
FIG._5

VARIABLE CAPACITANCE INTEGRATED CIRCUIT USABLE IN TEMPERATURE COMPENSATED OSCILLATORS

BACKGROUND OF THE INVENTION

This invention relates generally to variable capacitance means and more particularly to variable capacitance means fabricated in integrated circuits to adjust the frequency of a highly accurate temperature compensated oscillator, such as quartz or crystal oscillator which have many different kinds of applications, such as in communication systems, e.g., pagers, mobile subscriber sets or the like.

The frequency operation of crystal oscillators or resonators is subjected to variation to due to environmental conditions, particularly temperature, and due to aging. The operating frequency of the oscillator can be changed to compensate for such changes by the use of load capacitances placed in series with the oscillator. The frequency excursion experienced by the oscillator due to temperature changes depends on the type of oscillator and the value of the series load capacitance.

Many different approaches have been devised for providing temperature compensation of these oscillators, and a substantial number comprise means for measuring temperature excursion of the oscillator for a given load capacitance and compensating for the excursion by adjusting the value of the load capacitance to compensate for changes in frequency induced by ambient temperature changes so that the frequency of operation is returned to a predetermined value thereby stabilizing oscillation frequency. Laid-open patent application (Tokkaisho) 62-76801 to H. Nishihara, published Apr. 8, 1987, is one example that fairly represents the present state of the art wherein there is shown in FIG. 1 a variable capacitance array coupled in series with a crystal oscillator wherein the individual capacitor elements are each controlled by means of FET switches. An output, representing a temperature compensating value based upon the detected ambient temperature of the oscillator, is provided from a memory, such as a look-up table, and converted from series to parallel format and applied to the FET switches to selectively switch in and out capacitor elements in the capacitor array for selected connection thereof in series with the oscillator. The output is provided with a time constant by a charge/discharge circuit after which the capacitor switching takes place. The purpose of compensation is to improve the accuracy of a stabilized frequency in the oscillator output, i.e., the C/N ratio. However, since the oscillator drain capacitance is digitally changed, the oscillation frequency is changed, i.e., increased or decreased, abruptly so that fine frequency stabilization is not achieved. Furthermore, it has been difficult to date to fabricate charge/discharge circuits having sufficiently large time constants in semiconductor integrated circuit form.

In addition, because of the high level of accuracy required, it is necessary that each individual capacitance element employed in the capacitor array be of relatively small value. With an increased number in capacitor elements in the switched capacitor array, the capacitor elements are parasitic relative to FET switching capacitance, e.g., the source-drain capacitance or total impedance, reached a total capacitance value in the capacitor array that can not be ignored, and, as a result, the capacitance ratio of the on and off times of the capacitor array is small. Thus, adjustment of the oscillating frequency of the oscillator over a broad range becomes not possible. In addition, if the number of capacitor elements in the array is increased, the compensating memory capacity required to accommodate the increased capacitor element capacity translates into greater costs in manufacture and production of solid state temperature compensated oscillator integrated circuits.

Thus, it is an object of this invention to provide a temperature compensated crystal oscillator with improved temperature compensation resulting in enhanced frequency stability, which is highly reliable for use in communication systems.

It is another object of this invention to provide a variable capacitance means in a fully integrated circuit form that provides for smooth, fine incremental transitional change in equivalent capacitance relative to such means.

It is another object of this invention to provide a variable capacitance means that has improved fine adjustment capabilities for oscillation frequency adjustment of a crystal oscillator requiring a reduced memory capacity required for storing temperature compensation values requiring no increase in the number of discrete capacitance components in the capacitor circuit array of the variable capacitance means.

It is another object of this invention to offer a variable capacitance means that requires less switching, provides a large capacitance on/off ratio, and allows for fine adjustments to be made utilizing a small amount of memory capacity for required temperature compensating values.

SUMMARY OF THE INVENTION

According to this invention, a variable capacitance means comprises a capacitor array, associated switching elements and transient impedance varying means. The capacitor array comprises a plurality of capacitor elements connected to a common node coupled to a crystal oscillator in a crystal oscillator portion and each capacitor element includes a connected switching element that controls activation of selected capacitor elements that are selectively placed in operation as load capacitance with the crystal oscillator to change and adjust its frequency. Further, means are provided in a temperature compensation portion to selectively control the activation of the switching elements based upon decoded compensating values provided in memory, such as based upon sensed oscillator temperature conditions. The transient impedance varying means comprises multi-level voltage generating means for changing the continuity impedance of activated switching elements, among switching elements being switched, to another impedance level or one of a plurality of additional impedance levels. As a result, an intermediate impedance value can be created between the ON and OFF states of the switching elements so that there is no rapid change in the total capacitance imposed by the capacitor array resulting in smooth capacitance switching over time which corresponds to smoother frequency adjustment of oscillator output over time.

Because the capacitor array changes values very smoothly, an oscillation circuit employing the variable capacitor means of this invention will not experience rapid frequency fluctuations caused by switching FET switching elements that have the characteristic of rapid change in the combined equivalent capacitance of a capacitor element and impedance of an associated switching element at the point of switching threshold of the FET switching element thereby rendering it possible to secure a very fine stabilized frequency output from the oscillator. In addition, high resolution fine adjustments are possible because of a significant reduction in the required number of capacitor elements required for and because of the comparatively large capacitance values obtainable for individual capacitor elements compared to prior art temperature compensated oscillators. The reduction in capacitor elements or componenets required is due to the fact that this invention takes advantage of providing smaller discrete capacitor values, necessary to improve the fine control accuracy of the oscillation frequency, by changing the ON resistance of the switching elements in the capacitor element circuits. In this manner, an increase in the number of small discrete capacitors provided in the capacitor element array to provide for a higher level of fine oscillation frequency adjustment is not necessary. Thus, the ratio of parasitic capacitance can be reduced, allowing a wider range of frequencies in the case of controlling oscillation circuits because the higher number of capacitor element circuits in the capacitor circuit array, the greater the parasitic capacitance, and the greater parasitic capacitance correspondingly reduces the possible upper and lower limits of the adjustable range of the oscillation frequency. In other words, by reducing overall parasitic capacitance, the range over which frequency adjustment is possible is enhanced. Moreover, because the large area taken up by the capacitor on the surface of a semiconductor integrated circuit can be reduced as well as the memory capacity needed for storing temperature compensation values can be significantly reduced due to the approach of this invention, a lower cost variable capacitance array formed in an integrated circuit can now be realized.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a block diagram showing a variable capacitance means comprising this invention including a capacitor array, associated switching elements and impedance variation means.

FIG. 2 is a circuit diagram showing an equivalent circuit of a capacitor element circuit employed in the capacitor array shown in FIG. 1.

FIG. 3 is a graphic illustration of changes in equivalent capacitance in relation to the gate potential applied to switching elements of a capacitor element circuits in the capacitor array.

FIGS. 4 and 5 are detailed circuit schematic diagrams of the block circuit shown in FIG. 1.

DESCRIPTION OF THE PREFERRED EMBODIMENTS

FIG. 1 is a circuit diagram illustrating an embodiment of the variable capacitance means of this invention for providing selective variation in the drain load capacity for a crystal oscillator circuit. FIGS. 4 and 5 illustrate specific features of the circuit shown in FIG. 1 and, therefore, like elements in both figures carry the same numerical identification. The circuit of FIGS. 4 and 5 is fabricated as a semiconductor integrated circuit employing complementary MOS (CMOS) technology. However, other types of integrated circuit technology may be employed, e.g., bipolar or $T^2L$ technology.

The present invention basically differs from current technology in providing a plurality of electrical potentials through a D/A converter to the gates of a plurality of FET switching elements which function as capacitor switches and are described in connection with the description of FIG. 1.

In FIG. 1 there is an oscillator portion comprising components 23–27, a temperature compensating portion comprising components 1–8, a plurality of FET switching elements $10^1$, $10^2$ ... $10^n$ and capacitor array 22 comprising capacitor elements $20^1$, $20^2$ ... $20^n$. Capacitor elements 20 are preferably of equal value but may also be of weighted value or a combination of weighted and equal values. In the oscillator section, quartz crystal resonator 25 is connected across the gate and drain of inverter 27 in parallel with feedback resistor 26. The gate of inverter 27 and one side of resonator 25 is connected to a capacitor element circuit comprising input load capacitor 21 coupled to ground, and the drain of inverter 27 and the other side of resonator 25 is connected to a capacitor element circuit comprising output load capacitor 23 coupled to ground. The drain of inverter 27 is also connected to drain line 28 which forms a common node for connection of one electrode of all capacitor elements $20^1$, $20^2$ ... $20^n$. Each capacitor element $20^1$, $20^2$ ... $20^n$ has its other electrode connected to the drain of a FET $10^1$, $10^2$ ... $10^n$ which has its source connected to ground. FET switching elements 10 may be comprised of n-channel MOS transistors. The individual combinations of each capacitor element 20 together with a corresponding FET switching element 10 represent capacitor element circuits 24, all of which together constitute capacitor array 22. Each capacitor element circuit 24 has a combination equivalent impedance circuit 24' illustrated in FIG. 2 wherein capacitor element 20 has a capacitance, $C_A$, and FET switching element 10 has a combination impedance represented by parasitic capacitance, $C_X$, of the switching element and variable capacitance, $R_S$, which is the switching element resistance. This combination impedance, in particular $R_S$, varies in magnitude dependent upon the applied gate voltage of switching element 10 above threshold voltage, $V_{TH}$. This variance in magnitude of impedance is illustrated in FIG. 3 wherein at $V_{TH}$, the switching ON or OFF of element 10, the capacitance is $C_X$ but just above $V_{TH}$, there is a sudden jump or change in capacitance comprising the combination of $C_X$ and $C_A$. Thus the capacitance or impedance comprising circuit 24' is an important consideration in this invention in reducing rapid fluctuations or variations in oscillator frequency caused by switch-in or switch-out of capacitor element circuits 24 in capacitor array 22 during correction in operating frequency of resonator 25 based upon determined temperature compensation values.

The gates of FET switching elements 10 are connected to switching control circuit 8 in the temperature compensating portion through which selected FET gates are raised to threshold value to insert selected capacitance values in series with resonator 25 to change the operation frequency thereof in accordance with temperature compensating data received from the temperature compensating portion. The temperature compensating portion includes temperature sensor 1 comprising, for example, a thermistor or other such temperature sensing device in proximity to resonator 25 to detect its ambient temperature and produce an analog signal on its output representative of the ambient temperature at resonator 25. This analog signal is converted by A/D converter 2 into a digital signal, portions of which are respectively provided on outputs 31 and 32 from A/D converter 2. The most significant bits of the digital signal from A/D converter 2 are provided as output 31 to memory 3 and the least significant bits of the digital signal are provided as output 32 to reversing circuit 6. Memory 3 may be a ROM, EPROM or EEPROM or other such memory circuit and functions to store binary versions of temperature compensation data comprising a plurality of digital values representing ambient temperature values relative to resonator 25. Each digital value, therefore, corresponds to a specific temperature value within the overall range of temperature excursion encountered in the operation of resonator 25.

Output 31, comprising the most significant bits of the sensed temperature value, functions as an address signal to memory 3 in order to retrieve the corresponding temperature compensating value stored in the memory represented by this address. In the embodiment here, the temperature compensating value is represented by the most significant bits, e.g., d2 and d3. Output 32 comprises the least significant bits, d0 and d1, of the sensed temperature value and is provided as an input to D/A converter 7 via reversing circuit 6. Since a part of the temperature compensating value is supplied directly to D/A converter 7 for signal control of switching elements 10, i.e. two bits are supplied directly to reversing circuit 6, the capacity of memory 3 can be reduced, in the particular case here by one fourth.

The temperature compensation byte values stored in memory 3 are four bits comprising signals, D/U, D0, D1, and D2. While the number of bits employed here for these values is four, it is clear to those skilled in the art that a greater number of bits may be employed to improve the control accuracy of the oscillation frequency of resonator 25. Output 34 from memory 3 comprises D/U signal and is provided as an input to both reversing circuit 6 and D/A converter 7. D/U is a digital value that distinguishes the gradient of or change in the frequency vs. temperature characteristic curve relative to the oscillator circuit. In the case where such a characteristic is inclined upwardly, the signal value is LOW or "0". In the case where such a characteristic is declined downwardly, the signal value is HIGH or "1". As will be explained in greater detail later, reversing circuit 6 provides a reversal in signal values for D/A converter 7 which are employed to generate multiple voltage levels employed to change the impedance value of FET switching elements 10 during their change in switching state. Such a change in the switching element impedance level is a change in the equivalent impedance and capacitance of combination capacitor 20 and switching elements 10 comprising capacitor element circuits 24.

Output 33 of memory 3 is represented by three signals D0, D1 and D2, which are passed to (BCD) decoder 4 and their decoded values provided to linear converter circuit 5. As will be seen more clearly later, at least one of the outputs of decoder 4 will be rendered active by the decoding of Signals D0, D1 and D2. Alternatively, decoder 4 and linear circuit 5 can be eliminated if the output 33 from memory 3 is such that selected gate signals for selected FET switching elements $10^1 \ldots 10^n$ can be provided directly to switching control circuit 8 as gate control signals. However, by directly turning the FET switch on and off by means of the output from decoder 4, it is necessary for capacitor element circuits 24 to take on a weighted capacitance value. For this reason, this invention has been designed so that weighting control can be provided even with the presence of a linear conversion circuit 5 and even if each weighted capacitance value of each capacitor element circuit 24 in array 22 is to be equal. By doing this, the total required capacitance value of capacitor array 22 can be minimized, low-level switching noise can be achieved and a greater level of freedom of compensation becomes available.

The output of the D/A converter 7 is interpolated to an intermediate value that has been compensated for by the output of linear converter 5 via switching control circuit 8. In this invention, when intermediate interpolation takes place via the operation of D/A converter 7 and switching control circuit 8, the on-resistance of FET switching elements $10^1, 10^2, \ldots 10^n$ changes when these devices are activated and this change in resistance, in turn, changes the CR time constant of circuit 24 established between drain line 28 and ground.

Reference is now made to FIGS. 4 and 5 for a more detailed description of the temperature compensating portion. As shown in FIG. 4, capacitor element circuits $24^1 \ldots 24^n$ are selectively connected or disconnected relative to ground or reference potential by means of respective switching control circuits $81^1 \ldots 81^n$, and selected connection of individual capacitor elements $20^1, 20^2 \ldots 20^n$ to drain line 28 varies the total capacitance value provided from array 20. As an example, the switching in or out of capacitor elements 20 takes place via the combination of outputs from 3-bit-input decoder NAND circuits 41 in decoder 4 and outputs from D/A converter 7. The three inputs of each of the decoder circuits 41 are connected to receive either input D0, D1 or D2 or the inverted input of D0, D1 or D2 via inverters 44, 45 and 46. The outputs from decoder circuits 41 are provided as inputs to linear conversion circuit 5 comprising NAND gates $53^1, 53^2, \ldots 53^n$ connected to inverters $54^1, 54^2, \ldots 54^n$. Conversion takes place so that the boundary at which a capacitor circuit 10 is turning ON and OFF is always one that corresponds with the relative physical position of capacitor element circuits $20^1, 20^2 \ldots 20^n$. In other words, based upon the respective three inputs D0–D2 from memory 3 to all the decoder circuits 41, one of the outputs from a selected decoder circuit $41^m$ of a designated control unit circuit $A^a$ will be LOW, which is its active state, and all the outputs of all the other decoder circuits 41 will be HIGH. When these outputs are provided as inputs to linear converter circuits $53^1, 54^1 \ldots 53^n, 54^n$, providing connection laterally to all immediately adjacent or neighboring control unit circuits $A^1 \ldots A^n$, via lines $55^1, 55^2, \ldots 55^n$, control unit circuit $A^a$ as well as all control units $A^m$, i.e., all those to the right in FIG. 4 of activated control unit circuit $A^a$ (i.e., n: m>a), will be activated so that the selected capacitor element circuit $24^a$, corresponding to the activated decoder circuit $41^a$ of unit $A^a$ will be activated (a), i.e., connected to ground, and all the immediately adjacent capacitor element circuits $24^m$ of units $A^m$ will also be activated, i.e., connected to ground. All control units $A^i$, i.e., all those to the left in FIG. 4 of activated control unit circuit $A^a$ (i.e., n: m>a>i), will be or remain inactivated (i). As a result the drain capacitance of oscillator 25 is controlled by selective connection of one or more capacitor element circuits 24 in order to gradually monotonically increase or monotonically decrease the oscillator output. Thus, the drain capacitance can be gradually increased or decreased by incremental voltages, $V_{EE}$, as applied to one or more capacitor element circuits 24 via switching element 10.

As previously indicated, the most significant bits d2 and d3 are provided as output 31 to decoder 4. However, because the least significant bits, d0 and d1, on output 32 represent a secondary or tertiary curve of oscillator frequency-temperature characteristics, it is necessary to reverse the sequence of these bits in order to have temperature compensation that is smooth relative to different directional inclination or declination of inflection. In order to accomplish this, signals d0 and d1 are supplied to D/A converter 7 through reversing circuit 6. The reverse control signal, D/U, is provided from memory 3 to reversing circuit 6. Reversing circuit 6 comprises XOR gates 61 and 62, as shown in FIG. 5. The function of reversing circuit 6 in conjunction with converter 7 is to provide different $V_{EE}$ values for dynamic application as gate voltages to the gates of switching elements 10, which voltages are monotonically applied as an increasing or decreasing value to monotonically increase or decrease drain capacitance on oscillator 25 according to increases or decreases in ambient temperature. Thus, the drain capacitance of oscillator 25 can be controlled in fine increments by applying monotonically increasing or decreasing voltage gate values during the switching ON/OFF of switching elements 10 according to decoded inputs D0, D1 and D2, as illustrated in Tables I and II further below. With particular reference to FIG. 3, potentials, $V_{EE}$, are greater than threshold voltage, $V_{TH}$, but less than $V_{CC}$ so that they fall within the steep region of the C-$V_g$ characteristic curve of FIG. 3 between $C_X$ and $C_A$. Thus, for example, voltages, $V_{EE}$, may be $V_g=v_0, v_1,$ or $v_2$, where $V_{CC}>v_2>v_1>v_0>V_{TH}$, which are fairly equally distributed along the steep portion of the FIG. 3 curve providing either monotonically increasing or decreasing values of corresponding drain capacitance, C, i.e., $C_0$, $C_1$, or $C_2$ where $C_A>C_2>C_1>C_0>C_X$.

In FIG. 4, the control circuits for respective capacitor element circuits 24 form part of a circuit control unit, A, for each such circuit, which are, respectively, indicated by column rectangular dotted boxes $A^1$, $A^2$ . . . $A^n$. Each switching control circuit $81^1$, $81^2$, . . . $81^n$ comprises control circuit gates 84, 85 and 86 for controlling transfer transistors 184, 185 and 186. Gates 84, 86 receive inputs from circuits 4 and 5, comprising decoder circuit 41 and gates 53 and 54, to control the applied gate potential of respective FET switching elements 10 via operation of corresponding transfer transistors 84, 85 or 86. The three transfer transistors 184–186 in switching control circuit 81 respectively transmit the ON electrical potential ($V_{CC}$), the OFF electrical potential (connection to ground), or an intermediate electrical potential, $V_{EE}$, relative to the ON/OFF potential status of FET switching elements 10. These intermediate potentials, $V_{EE1}$ and $V_{EE2}$, are respectively on lines 181 and 182 and are applied alternately across array 22 to respective gates of switching transistors 10 via transfer transistors 186, which transistors are alternately connected to lines 181 and 182 across array 22. These intermediate potentials enable the drain capacitance to be incrementally changed from ground (OFF) to $V_{CC}$ (ON) in a monotonically increasing manner, or from $V_{CC}$ (ON) to ground (OFF) in a monotonically decreasing manner via variable potentials, $V_{EE}$. This functionality is particularly illustrated in Tables I and II below and discussed in further detail later.

As an example of the forgoing, in unit $A^2$ of FIG. 4, when the output for decoder circuit $41^2$ is LOW (active), the intermediate potential, $V_{EE2}$, which is an output from D/A converter 7, is transferred by means of operation of transfer transistor $186^2$. In the next adjacent unit to the left, $A^1$, the ON potential or connection to $V_{CC}$ will be transferred by means of transfer transistor $184^1$. In the next adjacent unit to the right, $A^m$ (i.e., n: m>a>1), the OFF electrical potential or connection to ground will be transferred by means of transfer transistor $185^m$. As a result, because FET switching elements $10^2$, . . . $10^n$ function as variable impedance or resistance, the active equivalent circuit 24' comprising capacitor element circuit 24 is as previously explained relative to FIG. 2.

The equalization capacitance, C, as viewed from drain line or common node 28, may be expressed as follows:

$$C = \frac{C_A * \left(C_X + \frac{1}{R_S}\right)}{C_A + C_X + \frac{1}{R_S}}$$

Also, for a given FET gate potential, $V_g$, $R_S = \propto 1/V_g$. Relative to this expression, the relationship between applied voltage, $V_g$, and the equivalent capacitance, C, is illustrated in FIG. 3. It is important to note from FIG. 3 that the equivalent capacitance, C, rapidly changes in value in the region of the threshold voltage, $V_{TH}$, of FET switching element 10. To control FET switching element 10 with a simple time constant circuit will, therefore, result in a rapid change in the equalization capacitance, C due to this relationship. The switching in or out of a capacitor element circuit 24 will cause an initial jump or drop in potential on drain line 28, as illustrated in FIG. 5 of the previously referred to reference of Nishihara. However, because of the intermediate potentials, $V_{EE1}$ or $V_{EE2}$, developed in D/A converter 7, the application of these intermediate potentials with large time constants, such as, several hundreds of $\mu$s to several ms, will be applied to a selected gate of a FET transistor 10 that prevent a rapid transition in equivalent capacitance just above threshold voltage, $V_{TH}$.

In FIG. 5, MOS transistor 161 in converter circuit 7 has the same channel length as FET switching transistors 10 and, further is fabricated to operate as a constant current source with a voltage close to threshold voltage, $V_{TH}$. The gate potential, $v_0$, of transistor 161, therefore, is close to $V_{TH}$. Resistances 162 and 163 together with MOS transistor 164 form a voltage divider circuit providing respective output $V_{EE}$ potentials $v_1$, $v_2$ and $v_3$ wherein $v_3>v_2>v_1>v_0$. Potential, $v_3$, is designed to be at a potential close to power supply voltage, $V_{CC}$. Load transistors 161, 164 provide a constant current source for resistances 162, 163. Electrical potentials $v_0$–$v_3$ are selected by analog MOS transistor switches 171–178 controlled by gates 72–79, and these potentials are selectively supplied to transfer transistors 185, 186, via supply lines 181 and 182, as intermediate voltage potentials, $V_{EE1}$ and $V_{EE2}$. Since electrical potentials $v_0$-$v_3$ are generated through high impedances comprising resistances 162, 163 in combination with the impedance of analog transfer MOS transistors 171–178, these intermediate voltage potentials are supplied to the gates of FET switching elements 10 with significantly large RC time constants and, as a result, provide for a smoother transitional change in equivalent capacitance, C, value during the switching in and out of switching elements 10.

When switching of control circuit units $A^m$ occurs relative to an activated control circuit unit, $A^a$, the $V_{EE}$ potential applied to the ON switching elements $10^m$ will change from $v_0$ to $v_2$ or from $v_3$ to $v_0$. Thus, there are instances when the gate potential of switching elements 10 are made to widely fluctuate through operation of transfer transistors 186. In order to prevent this wide change in intermediate voltage potential, there is provided two intermediate potentials, $V_{EE1}$ and $V_{EE2}$, thereby preventing a rapid and significant change in equivalent capacitance. When transfer gates 186 are OFF, the logic of gates 72–79 is configured so as to cause a change in the potential of $v_0$ and $v_3$. This logic is illustrated in Tables I and II.

Tables I and II illustrate the functionality of converter circuit 7 relative to monotonic increase of capacitance in the case where input D/U is LOW or "0", shown in Table I, and relative to monotonic decrease of capacitance in the case where input D/U is HIGH or "1", shown in Table II. In these illustrations, voltage changes for active control circuit unit $A^a$ are shown together with voltage changes for the adjacent control units $A^m$, in the example here limited to units $A^{m+1}$ and $A^{m+2}$.

TABLE I

| When D/U = "0" (Capacitance, C, monotonically increased) | | | | | | | | | | | |
|---|---|---|---|---|---|---|---|---|---|---|---|
| D0 | 0 | | | | 1 | | | | 0 | | |
| d0 | 0 | 1 | 0 | 1 | 0 | 1 | 0 | 1 | 0 | 1 | 0 | 1 |
| d1 | 0 | 0 | 1 | 1 | 0 | 0 | 1 | 1 | 0 | 0 | 1 | 1 |
| $V_{EE1}$ | $v_0 \rightarrow v_1$ | | $v_2 \rightarrow V_{CC}$ | | $V_{CC}$ | | $v_0$ | | $v_0 \rightarrow v_1$ | | $v_2 \rightarrow V_{CC}$ | |
| $V_{EE2}$ | $V_{CC}$ | | $v_0$ | | $v_0 \rightarrow v_1$ | | $v_2 \rightarrow V_{CC}$ | | $V_{CC}$ | | $v_0$ | |
| Unit $A^n$ | $A^a$ | | | | $A^{m+1}$ | | | | $A^{m+2}$ | | | |

In Table I, for monotonic increase in equivalent capacitance during switch-on, active unit $A^n$, e.g., unit $A^1$ in FIG. 4, is switched, via $V_{EE1}$ on line 181, from $v_0$ to $v_1$ to $v_2$ to $V_{CC}(v_3)$. The next adjacent unit, $A^{m+1}$, such as unit $A^2$ in FIG. 4, is similarly switched, via $V_{EE2}$ on line 182, from $v_0$ to $v_1$ to $v_2$ to $V_{CC}$. The next further adjacent unit $A^{m+2}$ is switched, via $V_{EE1}$ on line 181, from $v_0$ to $v_1$ to $v_2$ to $V_{CC}$ and so on.

TABLE II

| When D/U = "1" (Capacitance, C, monotonically decreased) | | | | | | | | | | | |
|---|---|---|---|---|---|---|---|---|---|---|---|
| D0 | 0 | | | | 1 | | | | 0 | | |
| d0 | 0 | 1 | 0 | 1 | 0 | 1 | 0 | 1 | 0 | 1 | 0 | 1 |
| d1 | 0 | 0 | 1 | 1 | 0 | 0 | 1 | 1 | 0 | 0 | 1 | 1 |
| $V_{EE1}$ | $V_{CC} \rightarrow v_2$ | | $v_1 \rightarrow v_0$ | | $v_0$ | | $V_{CC}$ | | $V_{CC} \rightarrow v_2$ | | $v_1 \rightarrow v_0$ | |
| $V_{EE2}$ | $v_0$ | | $V_{CC}$ | | $V_{CC} \rightarrow v_2$ | | $v_1 \rightarrow v_0$ | | $v_0$ | | $V_{CC}$ | |
| Unit $A^n$ | $A^a$ | | | | $A^{m+1}$ | | | | $A^{m+2}$ | | | |

In Table II, for monotonic decrease in equivalent capacitance during switch-off, active unit $A^n$, e.g., unit $A^1$ in FIG. 4, is switched, via $V_{EE1}$ on line 181, from $V_{CC}(v_3)$ to $v_2$ to $v_1$ to $v_0$. The next adjacent unit, $A^{m+1}$, is similarly switched, via $V_{EE2}$ on line 182, from $V_{CC}$ to $v_2$ to $v_1$ to $v_0$. The next further adjacent unit $A^{m+2}$ is switched, via $V_{EE1}$ on line 181, from $V_{CC}$ to $v_2$ to $v_1$ to $v_0$ and so on.

It is to be noted that the testing of such a capacitor array switching circuit shown in FIGS. 4 and 5 generally cannot be effectively performed with an LSI tester. For this reason, an on-chip test circuit 90 is provided and comprises transfer gates $93^1$, $94^1$; $93^2$, $94^2$, ... $93^n$, $94^n$ for respective control units $A^1$, $A^2$, ... $A^n$, wherein the gate potential of switching elements 10 can be monitored at monitoring output terminal, MO, via pairs of series connected test and transfer gates 93, 94. Test transistors 93 provide a lead directly to the gate potential of switching elements 10 which are directly monitored through respective transfer transistors 94. Transistors 94 are required because without them, terminal, MO, transistors would be connected directly to some of the gates of switching elements 10 and, as a result, interference or crosstalk from terminal, MO, would tend to significantly change the ON resistance for switching elements 10. Therefore, transistors 94 provide an isolation or cutoff from this path of interference during normal circuit operation and usage. Thus, for testing circuits 24 of capacitor array 22, test terminal, TEST, is provided with a HIGH level signal and transfer transistors 94 are operated, via inverter 97, to observe and check the gate potentials of switching elements 10, via test transistors 93, at terminal, MO.

Test MOS transistors 93 are functionally operated from decoder 41, via inverter 86 in switching control circuit 8. Thus, a test circuit is fabricated relative to each capacitor element circuit 24 so that the gate potential of the respective FET switching elements 10 can be monitored via monitoring output pin terminal, MO. Therefore, only units A in which the output of decoder 4 is active will be selected and provide an output at terminal, MO, relative to the gate potential of the FET switching element 10 of the activated unit A. In this manner, the operation of the circuit units responsible for controlling the voltage level applied to the gates of FET switching elements 10 is rendered directly testable by test circuit 90 thereby allowing for direct on-chip testing for immediate determination of the reliability of capacitor array 22 and the variable impedance operation brought about by operation of circuits 4–8.

While the invention has been described in conjunction with several specific embodiments, it is evident to those skilled in the art that many further alternatives, modifications and variations will be apparent in light of the forgoing description. For example, the capacitance means of this invention is not limited to just the temperature compensation of oscillator circuits, but may be used in other applications that employ variable capacitance means, such as filters and tuning devices and applications utilizing circuit time constants as well as to electronic circuits that require the fine programmable adjustments of variable capacitance means of this invention without rapid changes in equivalent capacitance during capacitor element circuit switch-in or switch-out in the compensation network. Further, while the above example of the capacitor array has been fabricated on the output side of the oscillator inverter 27, the capacitor array could also be fabricated on the input side of the oscillator amplifier 27 or on both the input and output sides of the oscillator inverter 27. Also, the possible potentials, $V_g = v_0$, $v_1$, $v_2$, or $v_3$, for intermediate potentials, $V_{EE}$, between ground and $V_{CC}$ can be a greater number than illustrated above. Thus, the invention described herein is intended to embrace all such alternatives, modifications, applications and variations as may fall within the spirit and scope of the appended claims.

What is claimed is:

1. Variable capacitance means formed in an integrated circuit comprising a plurality of capacitor element circuits each having an associated capacitor element, at least some of said capacitor element circuits having a switching element to control the switch-in or switch-out of an associated capacitor element, each of said switching elements undergoing a transient impedance change when activated to either an ON or OFF state, each of said capacitor elements connected on one side to one side of said switching elements and connected on their other side to a common node, the other side of said switching elements connected to a common reference potential, the improvement comprising means providing a plurality of intermediate potential levels to incrementally change the transient impendance of said switching elements when said capacitor element circuits are switched into or switched out of connection relative to said common node during said activation of selected ones of said switching elements whereby fluctuations experienced in the voltage level at said common node during said switching element activation are abated.

2. The variable capacitance means of claim 1 wherein said switching elements are FET transistor with control gates, voltage control means connected to said gates to apply a predetermined voltage level to activate selected ones of said switching elements to minimize the transient impedance change of said switching elements upon said activation.

3. The variable capacitance means of claim 2 wherein said voltage control means compises voltage generating means having at least two different intermediate voltage levels between a source potential and reference potnetial, said voltage control means applying a selected one of said intermediate voltages to the control gate of one of said activated switching elements.

4. The variable capacitance means of claim 2 including voltage generating means to provide multi-level voltage levels for applying to said FET transistor gates via said voltage control means.

5. The variable capacitance means of claim 1 wherein at least one of said capacitor element circuits comprises a capacitor connected directly to said common node.

6. The variable capacitance means of claim 1 wherein said associated capacitor elements are of equal value.

7. The variable capacitance means of claim 1 wherein said associated capacitor elements have weighted values.

8. The variable capacitance means of claim 1 wherein said associated capacitor elements have a combination of equal and weighted values.

9. Variable capacitance means formed in an integrated circuit comprising a plurality of capacitor element circuits each having an associated capacitor element, at least some of said capacitor element circuits having a switching element to control the switch-in or switch out of an associated capacitor element, each of said switching elements undergoing a transient impedance change when activated to an ON or OFF state, each of said capacitor elements connected on one side to one side of said switching elements and connected on their other side to a common node, the other side of said switching elements connected to a common reference potential, the switching of selected of said switching elements providing a selected equivalent capacitance applicable at said common node, the improvement comprising means providing a plurality of intermediate potential levels with large RC time constants for applying incremental to voltages to selected of said switching elements to incrementally increase or decrease said selected equivalent capacitance at said common node during the period of activation of said selected switching elements to an ON or OFF state.

10. A temperature compensated oscillator comprising an oscillator section having a resonator connected to a common node for providing an output frequency, a temperature compensating section to compensate for a change in the oscillator frequency due to a temperature change relative to said oscillator, and variable capacitance means comprising a plurality of capacitor element circuits each having a capacitor element, at least some of said capacitor element circuits having a switching element to control the switch-in or switch-out of an associated capacitor element, said switching elements for switching selected of said capacitor element circuits for connection or disconnection relative to said common node, said temperature compensating section comprising first converter means providing a digital value representative of the temperature conditions at said oscillator, memory means for receiving one portion of said digital value and in response thereto to provide a digital output representative of at least one of said selected capacitor element circuits for connection to said common node, second converter means for receiving the other portion of said digital value to produce at least two different intermediate voltage levels between a source potential and reference potnetial, and voltage control means to receive said digital output to apply a selected one of said intermediate voltage levels to said selected capacitor element circuit to activate said selected circuit switching element to minimize the transient impedance change of said switching elements upon their activation.

11. The temperature compensated oscillator of claim 10 wherein said switching elements are FET transistors with control gates, voltage control means connected to said gates to apply a predetermined voltage level to activate selected ones of said switching elements to minimize the transient impedance change of said switching elements upon said activation.

12. The temperature compensated oscillator of claim 11 wherein said voltage control means comprises voltage generating means having at least two different intermediate voltage levels between a source potential and reference potential, said voltage control means applying a selected one of said intermediate voltages to the control gate of one of said activated switching elements.

13. The temperature compensated oscillator of claim 11 including voltage generating means to provide multi-level voltage levels for applying to said FET transistor gates via said voltage control means.

14. The temperature compensated oscillator of claim 10 wherein at least one of said capacitor element circuits comprises a capacitor connected directly to said common node.

15. The temperature compensated oscillator of claim 10 wherein said associated capacitor elements are of equal value.

16. The temperature compensated oscillator of claim 10 wherein said associated capacitor elements have weighted values.

17. The temperature compensated oscillator of claim 10 wherein said associated capacitor elements have a combination of equal and weighted values.

18. A temperature compensated oscillator comprising an oscillator section having a resonator connected to a common node for providing an output frequency, a temperature compensating section to compensate for a change in the oscillator frequency due to a tempeature change relative to said oscillator, and variable capacitance means formed in an integrated circuit comprising a plurality of capacitor element circuits each having an associated capacitor element, at least some of said capacitor element circuits having a switching element to control the switch-in or switch-out of an associated capacitor element, each of said switching elements undergoing a transient impedance change when activated to an ON or OFF state, each of said capacitor elements connected on one side to one side of said switching elements and connected on their other side to a common node, the other side of said switching elements connected to a common reference potential, the switching of selected ones of said switching elements providing a selected equivalent capacitance applicable at said common node, the improvement comprising means for applying incremental voltages to selected ones of said switching elements providing a plurality of intermediate potential levels with large RC time constants to incrementally increase or decrease said selected equivalent capacitance at said common node during the period of activation of said selected switching elements to an ON or OFF state.

19. In a communication system, a temperature compensated oscillator comprising an oscillator section having a resonator connected to a common node for providing an output frequency, a temperature compensating section to compensate for a change in the oscillator frequency due to a temperature change relative to said oscillator, and variable capacitance means comprising a plurality of capacitor element circuits each having a capacitor element, at least some of said capacitor element circuits having a switching element to control the switch-in or switch-out of an associated capacitor element, said switching elements for switching selected ones of said capacitor element circuits for connection or disconnection relative to said common node, said temperature compensating section comprising first converter means providing a digital value representative of the temperature conditions at said oscillator, memory means for receiving one portion of said digital value and in response thereto to provide a digital output representative of at least one of said selected capacitor element circuits for connection to said common node, second converter means for receiving the other portion of said digital value to produce at least two different intermediate voltage levels between a source potential and reference potential, and voltage control means to receive said digital output to apply a selected one of said intermediate voltage levels to said selected capacitor element circuit to activate said selected circuit switching element to minimize the transient impedance change of said switching elements upon their activation.

20. In the communication system of claim 19 wherein said switching elements are FET transistors with control gates, voltage control means connected to said gates to apply a predetermined voltage level to activate selected ones of said switching elements to minimize the transient impedance change of said switching elements upon said activation.

21. In the communication system of claim 20 wherein said voltage control means comprises voltage generating means having at least two different intermediate voltage levels between a source potential and reference potential, said voltage control means applying a selected one of said intermediate voltages to the control gate of one of said activated switching elements.

22. In the communication system of claim 20 including voltage generating means to provide multi-level voltage levels for applying to said FET transistor gates via said voltage control means.

23. In the communication system of claim 19 wherein at least one of said capacitor element circuits comprises a capacitor connected directly to said common node.

24. In the communication system of claim 19 wherein said associated capacitor elements are of equal value.

25. In the communication system of claim 19 wherein said associated capacitor elements have weighted values.

26. In the communication system of claim 19 wherein said associated capacitor elements have a combination of equal and weighted values.

27. The variable capacitance means of claim 1 wherein said intermediate potential levels are substantially equally determined so that a change in said transient impedance is correspondingly equally divided.

28. The temperature compensated oscillator of claim 10 wherein said oscillator section, except for said resonator, and said temperature compensation section are formed together as an integrated circuit.

* * * * *